United States Patent [19]
Fukumoto

[11] Patent Number: 5,994,184
[45] Date of Patent: *Nov. 30, 1999

[54] SEMICONDUCTOR MEMORY DEVICE AND METHOD OF MANUFACTURING THE SAME

[75] Inventor: Takahiro Fukumoto, Yamatokoriyama, Japan

[73] Assignee: Matsushita Electronics Corporation, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/884,874

[22] Filed: Jun. 30, 1997

Related U.S. Application Data

[62] Division of application No. 08/693,875, Aug. 5, 1996, which is a division of application No. 08/445,925, May 22, 1995, Pat. No. 5,625,212, which is a continuation of application No. 08/036,072, Mar. 23, 1993, abandoned.

[30] Foreign Application Priority Data

Mar. 23, 1992 [JP] Japan ................................. 4-064591

[51] Int. Cl.⁶ ................................................ H01L 21/8247
[52] U.S. Cl. ............................................. 438/257; 438/266
[58] Field of Search ....................................... 438/257–267

[56] References Cited

U.S. PATENT DOCUMENTS

| | | |
|---|---|---|
| 4,328,565 | 5/1982 | Harari . |
| 4,380,863 | 4/1983 | Rao . |
| 4,652,897 | 3/1987 | Okuyama et al. . |
| 4,698,787 | 10/1987 | Mukherjee et al. . |
| 4,794,565 | 12/1988 | Wu et al. . |
| 4,868,629 | 9/1989 | Eitan . |
| 4,894,802 | 1/1990 | Hsia et al. . |
| 5,019,879 | 5/1991 | Chiu . |
| 5,147,811 | 9/1992 | Sakagami . |
| 5,242,848 | 9/1993 | Yeh . |
| 5,316,961 | 5/1994 | Okazawa . |
| 5,432,109 | 7/1995 | Yamada . |
| 5,453,388 | 9/1995 | Chen et al. . |
| 5,455,184 | 10/1995 | Tigelaar . |
| 5,572,054 | 11/1996 | Wang et al. ............................ 257/322 |
| 5,674,764 | 10/1997 | Liu et al. . |

*Primary Examiner*—Richard Booth
*Attorney, Agent, or Firm*—Ratner & Prestia

[57] ABSTRACT

On a semiconductor substrate, a floating gate electrode composed of a first layer of polysilicon is disposed through a gate dielectric film, and the drain diffusion layer contacts with the floating gate electrode by self-alignment. The source diffusion layer is disposed to have an offset. The control gate electrode is formed through the ON film and second gate dielectric film on the floating gate electrode. The control gate electrode is formed to cover the offset region. The first gate dielectric film is formed entirely of the tunneling dielectric film at least in the region beneath the floating gate electrode. In such constitution, an electrically erasable and programmable semiconductor memory device small in cell area and excellent in matching with other process may be obtained.

9 Claims, 7 Drawing Sheets

SEMICONDUCTOR MEMORY DEVICE AND METHOD OF MANUFACTURING THE SAME

This application is a division of application Ser. No. 08/693,875, filed Aug. 5, 1996, which is a divisional of Ser. No. 08/445,925, May 22, 1995, U.S. Pat. No. 5,625,212, which is a continuation of Ser. No. 08/036,072, filed Mar. 23, 1993, abandoned.

BACKGROUND OF THE INVENTION

1. Field of the Invention

The present invention relates to a semiconductor memory device comprising a nonvolatile memory transistor composed of a floating gate type field effect transistor, and a method of manufacturing the same.

2. Description of the Related Prior Art

Hitherto is known a nonvolatile memory transistor composed of a floating gate type field effect transistor capable of writing and erasing by tunnel injection and tunneling erasure as one of the nonvolatile memory devices capable of writing and erasing electrically.

It is the principle of the nonvolatile memory transistor having the floating gate to vary the threshold voltage of the transistor and store the information, by tunnel injection of electric charge from the semiconductor substrate side through a thin dielectric film, or extracting the electric charge from the floating gate electrode side through the thin dielectric film, thereby changing the electric charge accumulated on the floating gate electrode on the dielectric film.

In case of using the nonvolatile memory transistor of the floating gate type in a semiconductor integrated circuit such as EEPROM (electrically erasable and programmable ROM), generally, in order to prevent excessive erasure when erasing, that is, to prevent the channel region beneath the floating gate electrode from being always in ON state due to excessive removal of electrons from the floating gate electrode, an offset region is provided, which can be controlled directly by a control gate electrode without being covered with the floating gate electrode.

Therefore, a conventional semiconductor memory device has such a sectional structure as shown in FIG. 20.

Herein, the region in which the thin silicon oxide film 4 is formed is generally formed by photolithography. That is, only the resist on the region formed the thin silicon oxide film 4 is removed, and the silicon oxide film 5 is removed using the resist as the mask. Afterwards, removing the resist and oxidizing again, a thin silicon oxide film 4 is formed.

In the conventional structure, the N type diffusion layer 2 formed in the substrate beneath the thin silicon oxide film 4 and the N type diffusion layer 3 corresponding to the drain of the memory cell must be electrically connected with each other. Besides, for stabilizing the writing characteristics of the semiconductor memory device, the region formed the thin silicon oxide film 4 must be formed so as not to be larger than the floating gate electrode 6 to be formed later.

In the conventional memory cell structure, since the size of the tunneling region is defined by the mask, it is difficult to reduce the size of the tunneling region itself. It is also necessary to obtain a sufficient alignment margin for the tunneling region and the floating gate electrode 6, and hence it is difficult to reduce the cell size, too. Still more, in the conventional memory cell structure, it is required to connect the N type diffusion layer 9 beneath the tunneling region and the N type diffusion layer 3 diffused by self-alignment from the end of the floating gate electrode 6 and the end of the control gate electrode 8, or to form a combined shape of the N type diffusion layer 9 beneath the tunneling region and the N type diffusion layer 3 diffused by self-alignment from the end of the floating gate electrode 6 and the end of the control gate electrode 8, preliminarily before forming the floating gate electrode 6. In the former case, the manufacturing process is complicated, and in the latter case, it is disadvantageous for reducing the memory cell because the one N type diffusion layer of the memory cell cannot be formed by self-alignment with the floating gate electrode.

SUMMARY OF THE INVENTION

A semiconductor memory device comprises a semiconductor substrate of one conductive type, a first diffusion layer and a second diffusion layer of reverse conductive type formed at a spacing in the semiconductor substrate, a gate dielectric film formed on the semiconductor substrate, a floating gate electrode formed on the gate dielectric film containing at least a part of the second diffusion layer and remote from the first diffusion layer, and a control gate electrode formed through a dielectric film so as to cover the surface of the floating gate electrode.

Alternatively, a semiconductor memory device comprises a semiconductor substrate of one conductive type, a first diffusion layer, a second diffusion layer, and a third diffusion layer of reverse conductive type formed individually at a spacing in the semiconductor substrate, a gate dielectric film to be used as a tunneling medium formed on the semiconductor substrate, two floating gate electrodes formed on the gate dielectric film between the first diffusion layer and second diffusion layer, and between the second diffusion layer and third diffusion layer, and a control gate electrode formed through a dielectric film so as to cover the individual surfaces of the two floating gate electrodes, with the end positions of the two floating gate electrodes containing at least the second diffusion layer, and the other ends of the two floating gate electrodes formed apart from the first diffusion layer and third diffusion layer.

A semiconductor memory device also comprises a semiconductor substrate of one conductive type, a first diffusion layer and a second diffusion layer of reverse conductive type formed at a spacing in the semiconductor substrate, a gate dielectric film formed on the semiconductor substrate, a floating gate electrode formed on the gate dielectric film containing at least a part of the second diffusion layer and remote from the first diffusion layer, and a control gate electrode formed through a dielectric film so as to cover the surface except for one side of the floating gate electrode.

A method of manufacturing a semiconductor memory device comprises a step of forming a gate dielectric film to be used as a tunneling medium on a semiconductor substrate of one conductive type, a step of forming a floating gate electrode on the gate dielectric film, a step of forming a first dielectric film on the floating gate electrode, a step of forming a continuous resist having one end in a part of the first dielectric film and the other end on the semiconductor substrate, a step of forming a first diffusion layer and a second diffusion layer by self-alignment using the resist, the floating gate electrode without forming the resist, and the first dielectric film as the mask, a step of forming a second dielectric film on the surface of the floating gate electrode, and a step of forming a control gate electrode so as to cover the floating gate electrode on which the first dielectric film and second dielectric film are formed.

A method of manufacturing a semiconductor memory device comprises a step of forming a gate dielectric film to be used as a tunneling medium on a semiconductor substrate of one conductive type, a step of forming a first conductive film to be used as a floating gate electrode on the gate dielectric film, a step of forming a first dielectric film on the first conductive film, a step of forming a second dielectric film on the surface of the first conductive film, a step of forming a second conductive film to be used as a control gate electrode so as to cover the floating gate electrode on which the second dielectric film is formed, a step of removing the second conductive film in a specific region on the second conductive film, second dielectric film, first dielectric film and first conductive film, and a step of forming at least two diffusion layers by self-alignment ion implantation using the second conductive film as mask.

A method of manufacturing a semiconductor memory device comprises a step of forming a gate dielectric film to be used as a tunneling medium on a semiconductor substrate of one conductive type, a step of forming a first conductive film to be used as a floating gate electrode on the gate dielectric film, a step of forming a first dielectric film on the first conductive film, a step of forming a second dielectric film on the surface of the first conductive film, a step of implanting ions of reverse conductive type of the semiconductor substrate from an oblique direction using the floating gate electrode on which the second dielectric film is formed as the mask, and a step of forming a control gate electrode so as to cover the floating gate electrode on which the second dielectric film is formed.

By such structure and manufacturing method of the invention, the tunneling region can be formed by self-alignment diffusing in the lateral direct ion of the N type diffusion layer from the end portion of the floating gate electrode. Therefore, the manufacturing process is simple and it is not necessary to consider the alignment margin, so that the memory cell area may be reduced.

DESCRIPTION OF THE PREFERRED EMBODIMENTS

Figure 1:
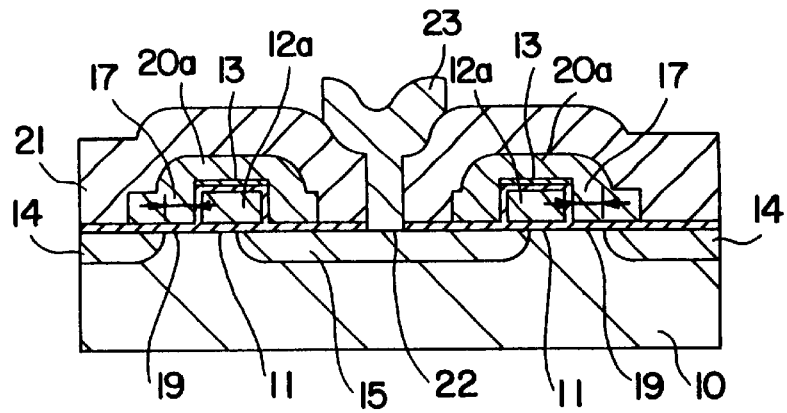
FIG. 1 is a sectional view for explaining a first embodiment of a semiconductor memory device of the invention.

Referring now to the drawings, some of the embodiments of the invention are described in detail below. FIG. 1 is a sectional view of a semiconductor memory device in an embodiment of the invention.

On a semiconductor substrate 10, a first gate dielectric film 11 is formed. On the first gate dielectric film 11, a floating gate electrode 12 composed of a first polysilicon film is formed. On the floating gate electrode 12a, an ON ( Oxide Nitride) film 13 is formed. A source diffusion layer 14 and a drain diffusion layer 15 are formed in the semiconductor substrate 10. In the channel region provided between the source diffusion layer 14 and drain diffusion layer 15, there is a region 17 covered with a control gate electrode 20a, but not covered with the floating gate electrode 12. The control gate electrode 20a is formed of a polysilicon film. On the entire surface of the substrate, an interlayer dielectric film 21 is formed. In the interlayer dielectric film 21, a metal wiring to be connected to the drain diffusion layer 15 is formed through a contact hole 22. Thus, in this memory cell structure, transistors having a channel region covered with a double structure of the floating gate electrode 12 and control gate electrode 20a are connected in series. Furthermore, the first gate dielectric film 11 in the lower part of the floating gate electrode 12a is formed of a thin silicon oxide film to be entirely used as a tunneling medium. This tunneling region responsible for exchange of electrons between the drain diffusion region 15 and floating gate electrode 12a makes use of the expanse of the drain diffusion layer 15 in the lateral direction. The expansion of the drain diffusion layer 15 in the lateral direction is realized by the self-alignment process making use of the position of the floating gate electrode 12a. Thus, the tunneling region does not depend on the exposure precision of photolithography, and can be stably reduced in size. As a result, reading and easing characteristics of the semiconductor memory device can be stabilized, and it can be applied to an ultrafine process in the future.

Figure 2:
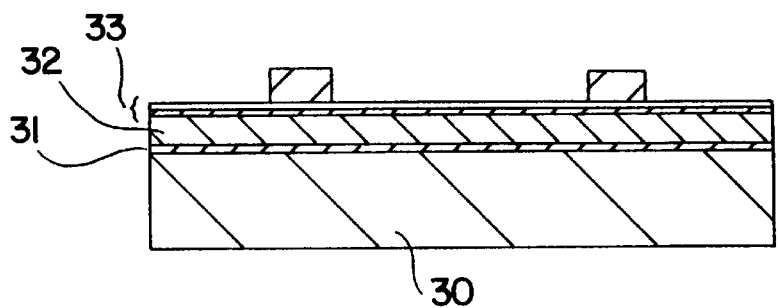
FIG. 2 is a process sectional view for explaining a first embodiment of a manufacturing method of a semiconductor memory device of the invention.
Figure 3:
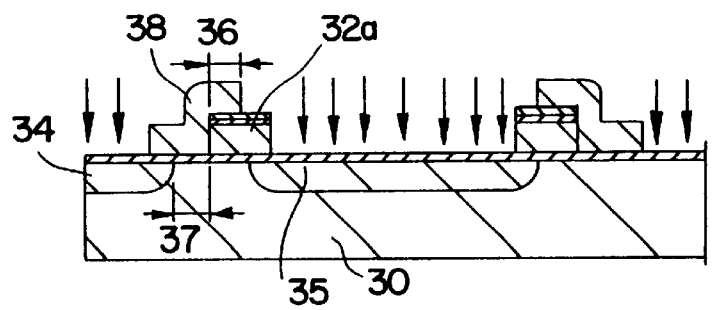
FIG. 3 is a process sectional view for explaining the first embodiment of a manufacturing method of a semiconductor memory device of the invention.
Figure 4:
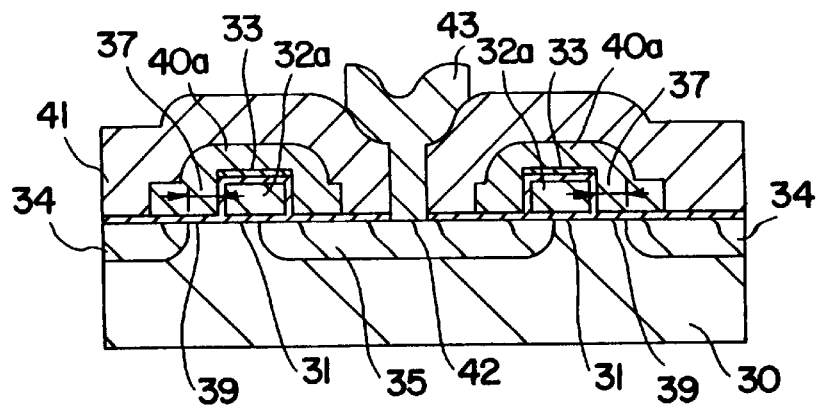
FIG. 4 is a process sectional view for explaining the first embodiment of a manufacturing method of a semiconductor memory device of the invention.

FIG. 2 through FIG. 4 show a first embodiment of a manufacturing method of semiconductor memory device of the invention in the process sequence.

In FIG. 2, first of all, a first gate dielectric film 31 to be used as a tunneling medium is formed on the surface of a semiconductor substrate 30 of one conductive type by the conventional thermal oxidation method. Herein, this semiconductor substrate 30 is of P type, with the plane azimuth of (100) and specific resistance of 10 to 15 Ω.cm. To utilize this gate dielectric film 31 effective as tunneling medium, a film thickness of about 8 to 10 nm is required, and it was set at 10 nm in this invention by employing the 900 deg. C. dilution oxidation method. Afterwards, on this gate dielectric film 31, a first polysilicon film 32 doped with phosphorus is formed by the conventional CVD (Chemical Vapor Deposition) method. At this time, the phosphorus doped amount is about $3\times10^{20}$ cm$^{-3}$. The film thickness of the polysilicon film 32 is desired to be thin in order to enhance the step coverage of the upper part in the two-layer polysilicon process. At the same time, however, when doping phosphorus, it must be controlled so that the phosphorus may not penetrate up to the gate dielectric layer 31 in the lower part of the polysilicon film 32. Accordingly, the film thickness of the polysilicon film 32 should be properly controlled in a range of 100 to 300 nm. Considering such point, the acceleration energy for doping phosphorus is used in a range of 40 to 60 keV, or the phosphorus is doped in CVD by POCl$_3$ or PH$_3$ gas. The resistance of the polysilicon film 32 is set at 20 to 30 Ω/square in order to keep a preferred film thickness of the thermal oxide film formed in the upper part. Subsequently, after thermally oxidizing the first polysilicon film 32, a nitride film is grown by the conventional LPCVD(Low Pressure CVD) method, thereby forming an ON film 33 on the first polysilicon film 32. The oxidation of the polysilicon film 32 at this time is done, in order to enhance the oxide film quality, by partial pressure oxidation using nitrogen (N$_2$) and oxygen (O$_2$), or oxidation method adding HCl thereto, at temperature of 950 to 1100 deg. C. The thickness of the oxide film formed by this oxidation is in a range of 10 to 20 nm. This is because the oxide film of the polysilicon film 32 should be as thin as possible, while the dielectric breakdown voltage of the semiconductor memory device should be about 17 V or more. Besides, the thickness of the nitride film formed herein is about 10 to 30 nm. It is the purpose of using the ON film 33 that the thickness can be reduced while keeping the breakdown voltage, as compared with a single layer of thermal oxide film.

Successively, in FIG. 2, the ON film 33 and first polysilicon film 32 are etched simultaneously by the ordinary photolithographic process, and the floating gate electrode 32a is patterned. The width of the floating gate electrode 32 after etching is about 1 μm. Then, in order to form regions for source diffusion layer 34 and drain diffusion layer 35 of the memory cell, a part 36 of the floating gate electrode 32a and an offset region 37 of the source diffusion layer 34 side are covered with a resist 38 patterned by conventional photolithography. Herein, the part 36 of the floating gate electrode 32a is formed to have a sufficient margin, even if the alignment is deviated laterally when forming the resist 38, so that the end of the resist 38 may not be remote from the end of the floating gate electrode 32a more than necessary. This margin is 0.5 μm. The length of the offset region 37 corresponds to the gate length of the transistor to be finally covered only with the control gate electrode 40a. Thus is considered the alignment deviation of the resist 38 so that punch-through may not occur when the memory cell is put in operation. It is set herein around 1 μm in consideration of the alignment deviation.

In FIG. 3, consequently, by the self-alignment technology, using the resist 38 and floating gate electrode 32a as the mask, ions of opposite conductive type of the semiconductor substrate 30 of one conductive type, that is, if the substrate is of P type, ions of N type such as arsenic ions or phosphorus ions are implanted, and a source diffusion layer 34 and a drain diffusion layer 35 are formed. When implanting arsenic ions, the acceleration energy is 60 to 80 keV, and in the case of phosphorus, it is 40 to 100 keV, and the dose is $10^{15}$ to $10^{14}$ cm$^{-2}$. After ion implantation, at a temperature of around 950 deg. C, annealing is performed for about 10 to 30 minutes in N$_2$ atmosphere. As a result, the source diffusion layer 34 and drain diffusion layer 35 are formed in a depth of about 0.3 to 0.5 μm, expanding in the lower parts of both floating gate electrode 32a and resist 38. Thus, the overlapping portion of the floating gate electrode 32a and drain diffusion layer 35 is the tunneling region.

In FIG. 4, after removing the resist 38, and etching and removing the silicon oxide film 32 except for the area beneath the floating gate electrode 32a, using the floating gate electrode 32a as mask, a second gate dielectric film 39 of the offset region is formed by thermal oxidation method. The thickness of the second gate dielectric film 39 is 20 to 30 nm on the silicon substrate 30, and an oxide film of 40 to 50 nm is formed on the polysilicon film. The oxide film is formed by the partial pressure oxidation using nitrogen (N$_2$) and oxygen (O$_2$), or oxidation method by adding HCl thereto, at temperature around 1000 deg. C. By this oxidation condition, the side wall of the floating gate electrode 32a is formed only of the oxide film composed in this process. It is hence necessary to form a favorable polysilicon oxide film to have a dielectric breakdown voltage of about 17 V in practical use. The thickness of the oxide film is determined by the first priority of satisfying the characteristics of the oxide film formed on the side of the floating gate electrode 32a, and it is defined in a range of 40 to 50 nm on the polysilicon film in relation with the dielectric breakdown voltage. At this time, the ON film 33 is also oxidized to be an ONO film. About 2 nm is oxidized on the ON film 33. If oxide film is not formed on the ONO film herein, the electric charge holding characteristic of the nonvolatile memory device is lowered. Hence, the oxide film formed herein greatly affects the reliability of the semiconductor memory device.

Afterwards, a second polysilicon film doped phosphorus is formed on the entire surface by the known CVD method. At this time, the phosphorus doping amount is about $3\times10^{20}$ cm$^{-3}$. The second polysilicon film is used as a control gate electrode, wiring and gate of peripheral transistors, and the film thickness should be thick enough to have a contact, and thicker than the first polysilicon film. It was 400 nm herein. The acceleration energy of ion implantation when doping phosphorus was about 80 to 100 keV, that is, slightly higher than the acceleration energy of the first polysilicon film. Therefore, the resistance of this polysilicon film is around 20 Ω/square so as to be suitable for using as wiring.

Consequently, by the conventional photolithography; the control gate electrode 40a is patterned. Herein, the control gate electrode 40a is formed over the source diffusion layer 34 and drain diffusion layer 35. The control gate electrode 40a is formed in direct contact with the offset region so as to overlap with the source diffusion layer 34. It is located so as to cover the floating gate electrode 32a in the portion occupied by the floating gate electrode 32a, and to overlap the drain diffusion layer 35 at the same time. Hence, the two transistors for composing the memory cell, that is, the transistor possessing the channel region covered only with the control gate electrode 40a, and the transistor possessing the channel region covered with two layers of floating gate electrode 32a and control gate electrode 40a are connected in series.

Next is formed an interlayer dielectric film 41, and a contact hole 42 is formed in the interlayer dielectric film 41 as an electrode take-out port. Then by patterning the metal wiring 43, the semiconductor memory device of the invention as shown in FIG. 4 is fabricated. Herein, the interlayer dielectric film 41 is formed of an NSG(Non-doped Silicate Glass) film in a thickness of 0.1 μm and a BPSG(Boron Phosphorus Silicate Glass) film in a thickness of 0.8 μm, grown by the atmospheric CVD process. The BPSG film is caused to reflow at temperature of around 900 deg. C, and flattens the upper surface of the interlayer dielectric film 41. These film thicknesses are determined in consideration of the parasitic capacity formed between the base substrate and metal wiring formed in a later process, and the inverting voltage characteristic.

Besides, since the forming condition at this time may affect the already formed transistors, the CVD process was selected so as to be capable of forming at low temperature as far as possible. The contact hole 42 opens the resist in the conventional photolithograhic process. The opening position is formed with margins across the contact hole 42, so as not to contact with the control gate electrodes of the transistors at both sides.

Figure 5:
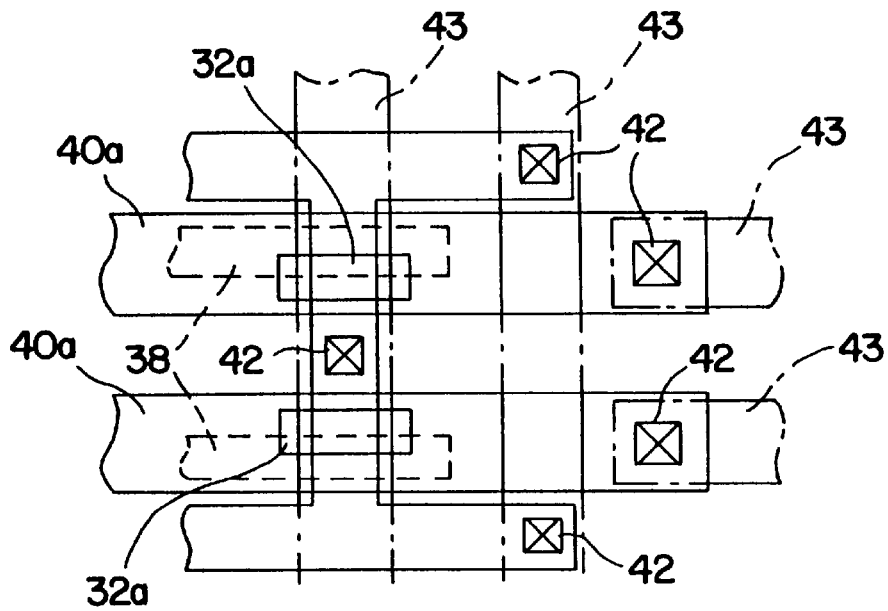
FIG. 5 is a plan view for explaining the semiconductor memory device obtained by the first embodiment of the manufacturing method of semiconductor memory device of the invention

FIG. 5 is a plan view of the semiconductor memory device of the invention shown in FIG. 4. Each memory cell is formed symmetrically on both sides of the contact hole 42 to the drain diffusion layer 35. Each drain diffusion layer 35 is connected to the metal wiring 43 in the vertical direction on the sheet of paper, and forms each bit line. The source diffusion layer 34 of each memory cell has source contact holes formed at its both ends. Connecting from the source contact to the metal wiring 43, a common source line is formed. Each control gate electrode 40a is connected to other metal wiring 43 at the end portion to form each word line. The control gate electrode 40a is formed to cover the floating gate electrode 32a. The drawing also shows the position of the resist 38 shown in FIG. 3.

Figure 6:
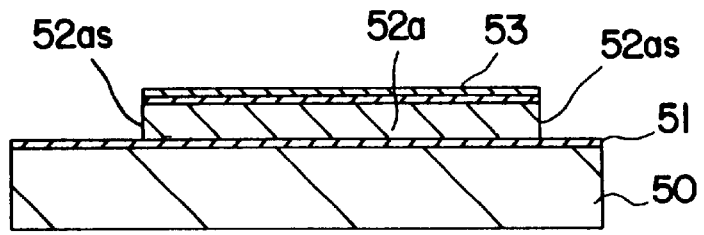
FIG. 6 is a process sectional view for explaining a second embodiment of a manufacturing method of a semiconductor memory device of the invention.

FIG. 6 through FIG. 10 shows the process sequence in a second embodiment of a manufacturing method of semiconductor memory device of the invention. As shown in FIG. 6, on a semiconductor substrate 50 of one conductive type, a floating gate electrode 52a composed of a first polysilicon film and an ON film 53 are formed through a first gate dielectric film 51 of about 10 nm to be used as a tunneling medium. Then the forming region side for a source diffusion layer 54 of the floating gate electrode 52a is processed same as in the first embodiment.

On the other hand, the forming region side for a drain diffusion layer 55 has the floating gate electrode 52a once patterned slightly larger so as to cover from the drain diffusion layer up to the contact region to be connected. Consequently, a region 52as at the source diffusion layer 54 side of the floating gate electrode 52a is fabricated in the same process as the manufacturing process of the first embodiment. By contrast, the floating gate electrode 52a is patterned larger than that so as to cover the drain diffusion layer 55 completely by consecutively forming a region 52ad at the end of the floating gate electrode 52a of the drain diffusion layer 55 side of the two memory cells located symmetrically on both sides of the drain diffusion layer 55. This is described in detail below.

Figure 7:
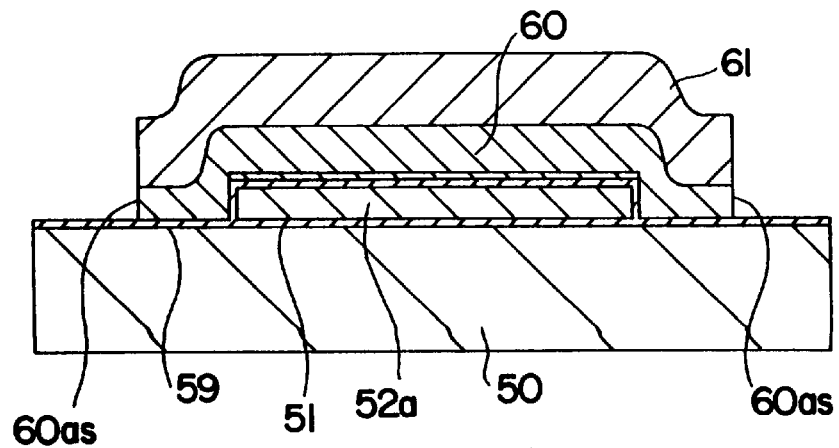
FIG. 7 is a process sectional view for explaining the second embodiment of a manufacturing method of a semiconductor memory device of the invention.

Succeedingly, as shown in FIG. 7, after the same step as in the first embodiment, a second gate dielectric film 59 is formed, and the entire surface of a second polysilicon film 60 is covered. The second polysilicon film 60 is etched by two steps of photolithography. That is, as shown in FIG. 7, using the resist 61 as the mask, the second polysilicon film 60 is etched, and the end 60 as of the control gate electrode 60a of the source diffusion layer 54 side is formed.

Figure 8:
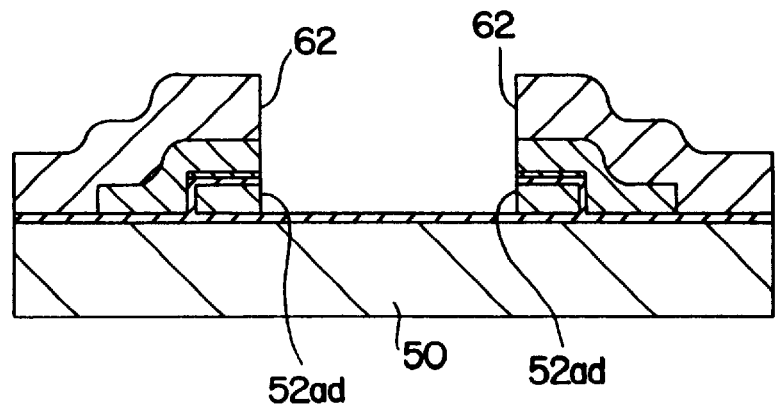
FIG. 8 is a process sectional view for explaining the second embodiment of a manufacturing method of a semiconductor memory device of the invention.

As shown in FIG. 8, in consequence, using other resist 62 as the mask, the second polysilicon film 60 from the top layer, the ON film 53 and floating gate electrode 52a are etched simultaneously by self-alignment, thereby forming the end 60ad of the control gate electrode 60a of the drain diffusion layer 55 side.

Figure 9:
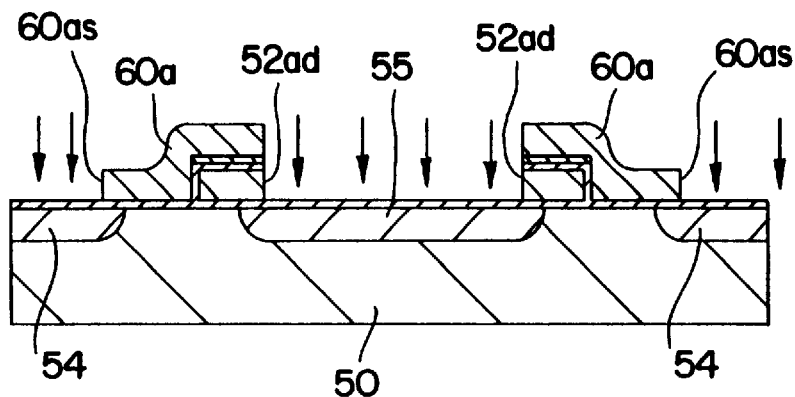
FIG. 9 is a process sectional view for explaining the second embodiment of a manufacturing method of a semiconductor memory device of the invention.

The opening width of the resist 62 herein corresponds finally to the region including both the control gate electrode 60a of the two memory cells positioned symmetrically on both side of the drain diffusion layer 55, and the space portion between these control gate electrodes 60a. This width is about 2 μm. The etching herein consists of the following three steps. In the first step, the polysilicon film 60 of the second layer is etched by anisotropic etching. In the second step, the ON film 53 (or ONO film) is processed by anisotropic etching using other gas. In the final third step, the polysilicon film which is the floating gate electrode 52a of the lower layer is etched in the same conditions as in the first step. After etching in this way, the width of the floating gate electrode 52a is about 1 μm. The width of the control gate electrode 60a is about 2 μm. Using thus formed control gate electrode 60a as mask, as shown in FIG. 9, by implanting ions of opposite conductive type as the semiconductor substrate 50 of one conductive type, the source diffusion layer 54 and drain diffusion layer 55 are formed by self-alignment. Then, at temperature of around 950 deg. C, annealing is performed for scores of minutes in $N_2$ atmosphere. As a result, the source diffusion layer 54 and drain diffusion layer 55 are formed by self-alignment corresponding to the electrode ends 60as, 52ad. Herein, the ion implantation conditions are acceleration energy of 60 to 80 keV for arsenic, and 40 to 100 keV for phosphorus, and dose of about $10^{15}$ to $10^{14}$ $cm^{-2}$.

After forming an interlayer dielectric film 63, a contact hole 64 is opened in each electrode take-out port by conventional photolithography. Then, by patterning the metal wiring 65, the semiconductor memory device as shown in FIG. 10 is fabricated.

Figure 10:
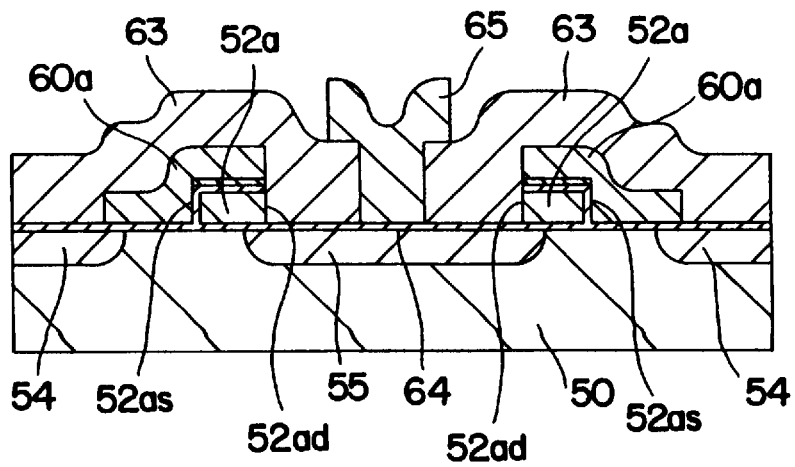
FIG. 10 is a process sectional view for explaining the second embodiment of a manufacturing method of a semiconductor memory device of the invention.
Figure 11:
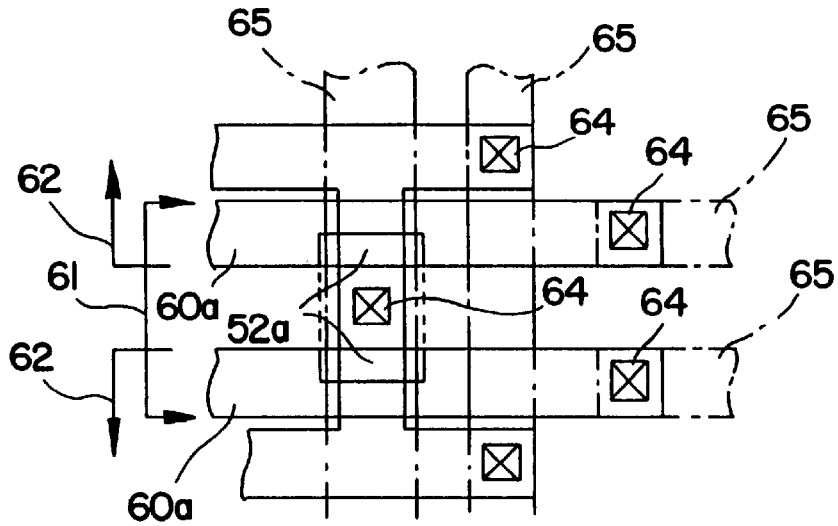
FIG. 11 is a plan view for explaining the semiconductor memory device obtained by the second embodiment of the manufacturing method of semiconductor memory device of the invention.

FIG. 11 is a plan view of the semiconductor memory device of the invention shown in FIG. 10. Each memory cell is formed symmetrically on both sides of a contact hole 64 to the drain diffusion layer 55. Each drain diffusion layer 55 is connected to the metal wiring 65 in the vertical direction on the sheet of paper, and each bit line is composed. The source diffusion layer 54 of each memory cell has source contact holes formed at both ends thereof. Linking from the source contact to the metal wiring 65, a common source line is formed. Each control gate electrode 60a is connected to other metal wiring 65 at the end, thereby forming each word line. The control gate electrode 60a is formed so as to cover the floating gate electrode 52a. The arrow indicated on the left side of the drawing indicates the position of the resist pattern formed by two steps of lithography. In the first step of lithography, resist 61 is formed so as to cover the region between two metal wirings 65 in the lateral direction on the sheet of paper and including two metal wirings 65. In the second step of lithography, resist 62 is formed the region except the resist 61. In particular, what is different from the plan view in the first embodiment shown in FIG. 5 is that the end part 52ad at the drain diffusion layer 55 side of the floating gate electrode 52a and the end part of the drain diffusion layer 55 side of the control gate electrode 60a are formed on the same line by self-alignment.

Referring then to FIG. 12 through FIG. 15, a third embodiment of manufacturing method of semiconductor memory device of the invention is described below.

Figure 12:
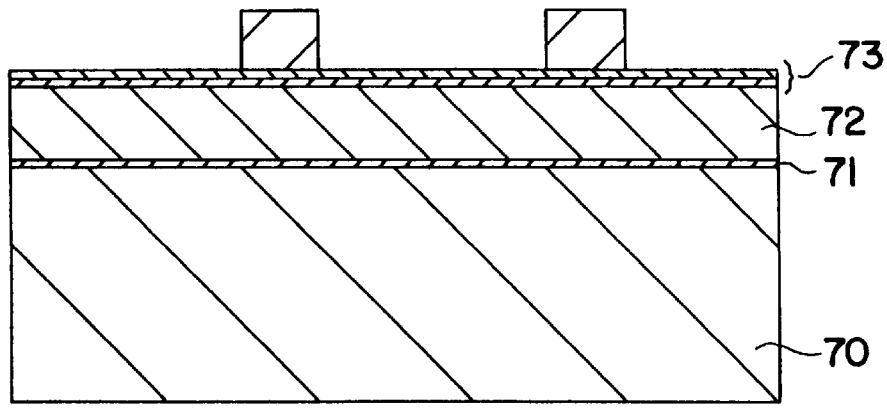
FIG. 12 is a process sectional view for explaining a third embodiment of a manufacturing method of a semiconductor memory device of the invention.

First, on a semiconductor substrate 70 of one conductive type, a first polysilicon film 72 and an ON film 73 are formed in this order through a first gate dielectric film 71 of about 10 nm in thickness to be used as a tunneling medium. Then, by conventional photolithograhic process, a resist pattern (not shown) is formed as etching mask of the first polysilicon film 72 (FIG. 12).

Figure 13:
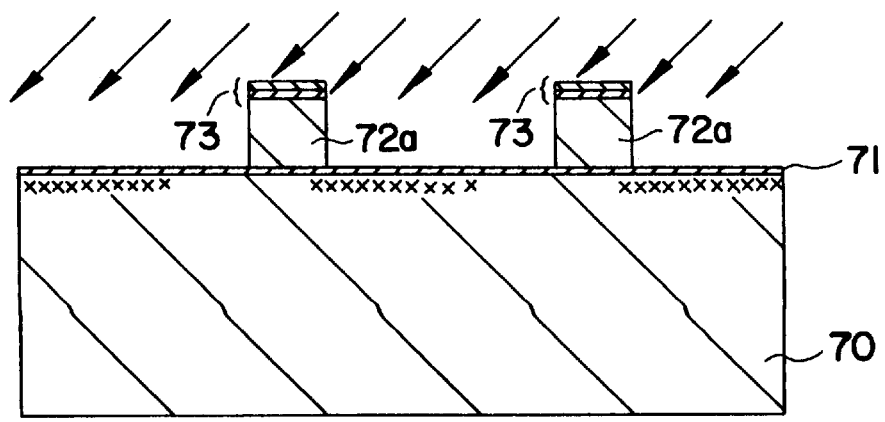
FIG. 13 is a process sectional view for explaining the third embodiment of a manufacturing method of a semiconductor memory device of the invention.

As shown in FIG. 13, consequently, using the resist pattern as the mask, the first polysilicon film 72 and ON film 73 are etched. Then the resist is removed. By this etching process, a floating gate electrode 72a is formed. Afterwards, an oblique ion implantation is applied to form source diffusion layer and drain diffusion layer of the memory cell. As ion implantation, ions of opposite conductive type for the semiconductor substrate 70, that is, if the semiconductor substrate 70 is of P type, N type ions such as arsenic ions and phosphorus ions are implanted. In this oblique ion implantation, ions are implanted to the substrate at an angle of 45 degrees from the right to the vertical direction. By the oblique ion implantation, ions are apart at a proper offset distance from the side in the shade of the floating gate electrode 72a of memory cell (the left side of each floating gate electrode 72a in FIG. 13), thereby forming an N type diffusion layer. At the same time, an N type diffusion layer is formed in the lower part of the floating gate electrode 72a end in the area not in the shade of the oblique ion implantation (the right side of each floating gate electrode 72a in FIG. 13).

Figure 14:
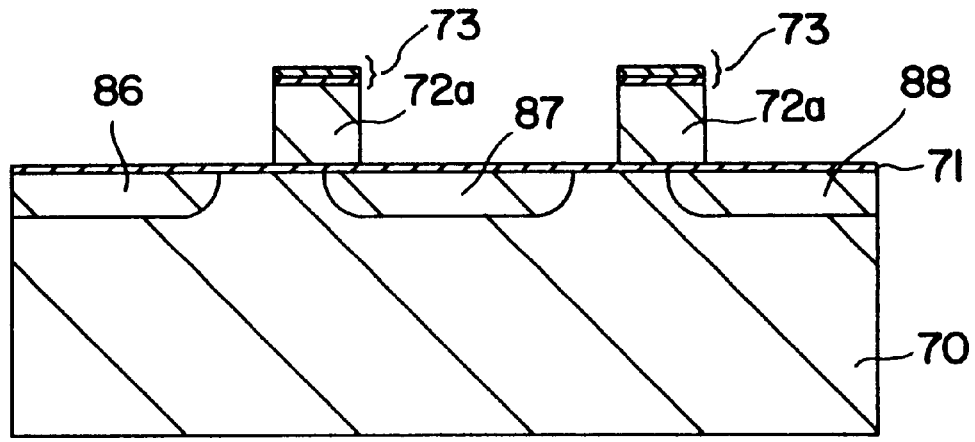
FIG. 14 is a process sectional view for explaining the third embodiment of a manufacturing method of a semiconductor memory device of the invention.

In the $N_2$ atmosphere, consequently, by annealing for about 30 minutes at temperature of 950 deg. C., these N type diffusion layers diffuse, and desired source diffusion layers 86, 88 and drain diffusion layer 87 are formed. In this way, the drain diffusion layer 87 of the memory cell gets in beneath the end of the floating gate electrode 72a, and the diffusion layer and floating gate electrode 72a overlap each other. On the other hand, the source diffusion layers 86, 88 are formed at a proper offset distance in the shade of the floating gate electrode 72a (FIG. 14).

Figure 15:
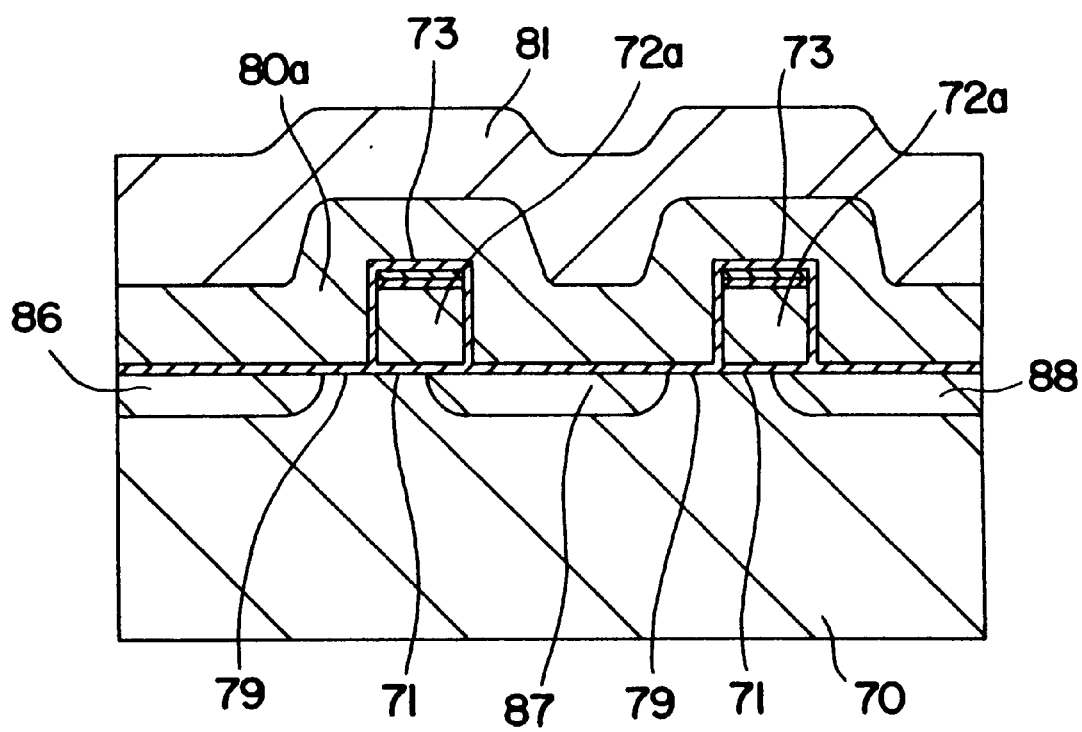
FIG. 15 is a process sectional view for explaining the third embodiment of a manufacturing method of a semiconductor memory device of the invention.

Finally, as shown in FIG. 15, a second gate dielectric film 79, a control gate electrode 80a, and an interlayer dielectric film 81 are formed in this order on the substrate (FIG. 15).

In this way, the resist mask indicated in the first embodiment of the manufacturing method of the semiconductor memory device is not needed, and the source diffusion layers 86, 88 and drain diffusion layer 87 can be formed by maskless self-alignment method. At this time, the ion implantation conditions are same as in the first and second embodiments of the manufacturing method of the semiconductor memory device. Incidentally, the expanse of the diffusion layer in the lateral direction by ion implantation is about 30 to 50 nm. Herein, the N type diffusion layers 86, 87, 88 in each memory cell may be either regions of source diffusion layer or drain diffusion layer. That is, the drain diffusion layer 87 as the N type diffusion layer in this embodiment may be the drain for the left side memory cell in FIG. 15, and the source for the right side cell. In this process, unlike the first embodiment of the manufacturing method of the semiconductor memory device, the resist mask for forming the source diffusion layer and drain diffusion layer is not needed, and the source diffusion layers 86, 88 and drain diffusion layer 87 can be formed by maskless self-alignment.

As clear from the description herein, according to the structure and manufacturing method of the invention, since the tunneling region is automatically controlled by the lateral diffusion of the N type diffusion layer from the floating gate electrode end, the manufacturing process is simple, and it is not necessary to take the alignment margin into consideration, so that stable operation and smaller cell area may be realized.

In the semiconductor memory device and its manufacturing method of the invention, since the tunneling region is defined by the diffusion of the N type diffusion-layer from the floating gate electrode end in the lateral direction, the manufacturing process is simple, and there is no discrepancy in the area of the tunneling region as experienced in the prior art, so that the coupling ratio in erasure can be stabilized and reduced in value.

To explain this point more specifically, the electric characteristics of the semiconductor memory device of the conventional structure and the semiconductor memory device formed in the embodiment are compared in FIG. 16 through FIG. 19.

Figure 16:
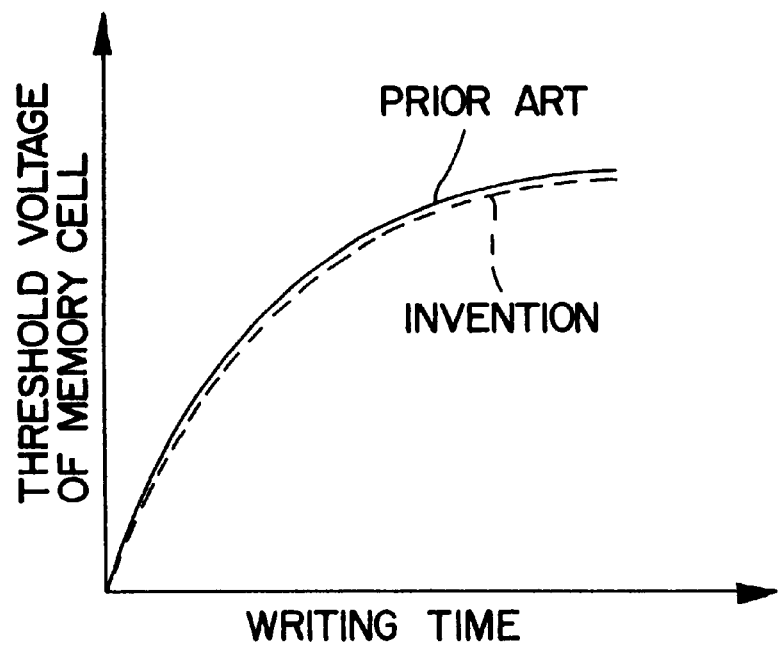
FIG. 16 is a diagram for explaining the relation between the write time and memory cell threshold voltage of the semiconductor memory device of the invention.
Figure 17:
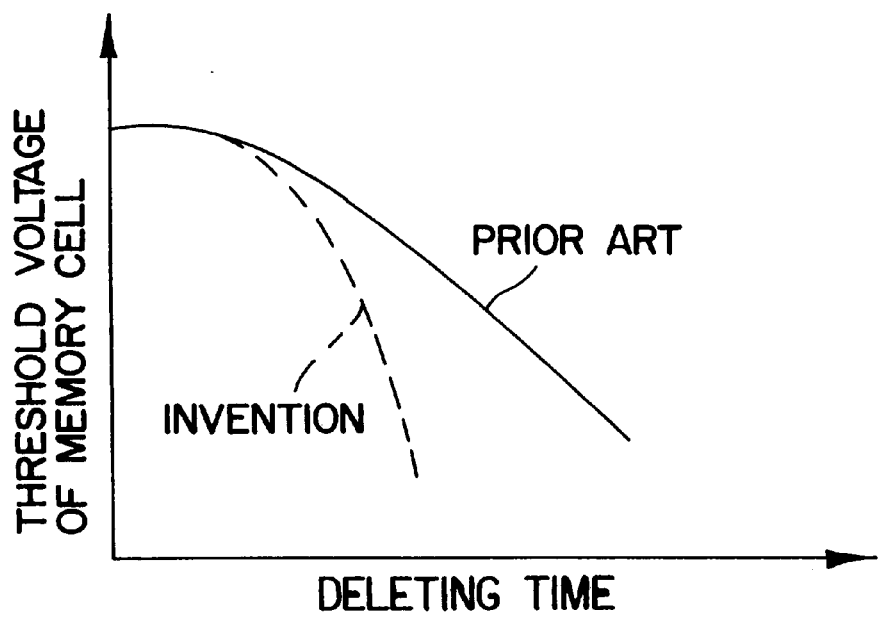
FIG. 17 is a diagram for explaining the relation between the erase time and memory cell threshold voltage of the semiconductor memory device of the invention.
Figure 18:
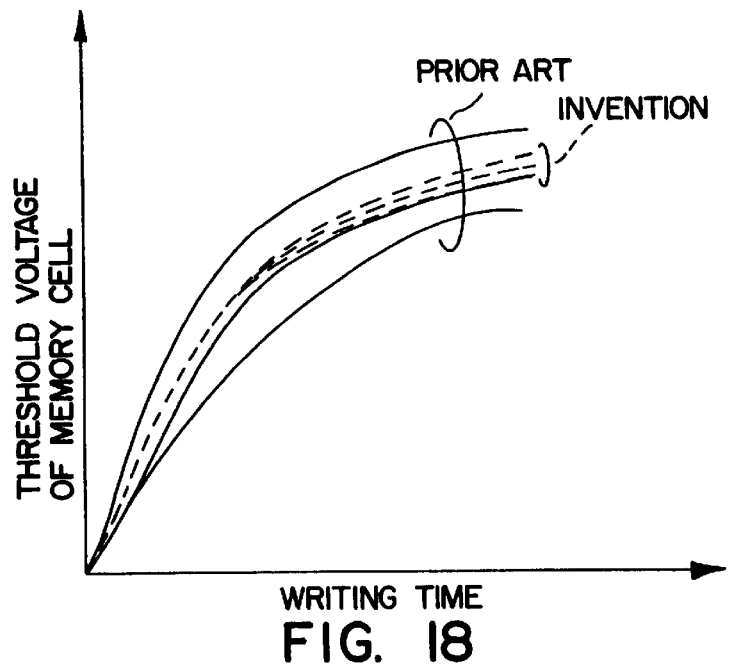
FIG. 18 is a diagram for explaining the relation between the write time fluctuations and memory cell threshold voltage of the semiconductor memory device of the invention.
Figure 19:
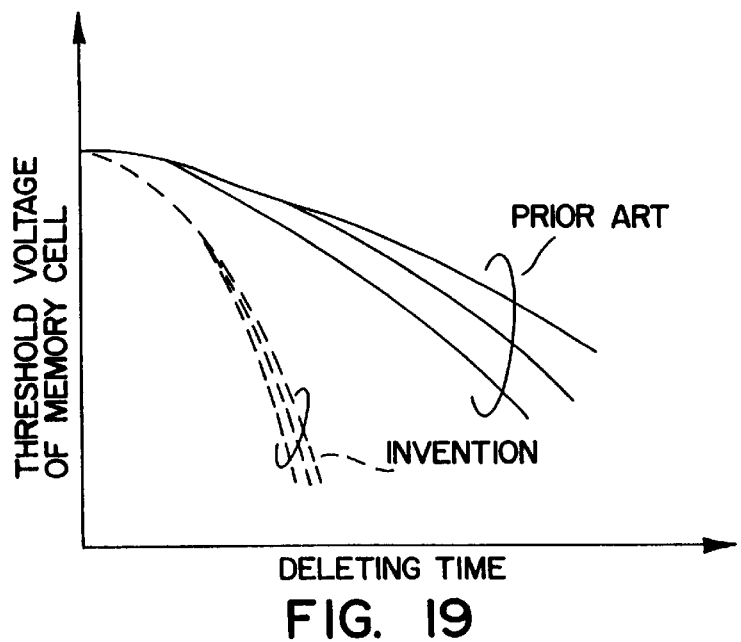
FIG. 19 is a diagram for explaining the relation between the erase time fluctuations and memory cell threshold voltage of the semiconductor memory device of the invention.
Figure 20:
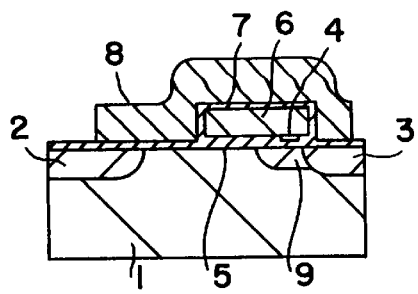
FIG. 20 is a sectional view of a conventional semiconductor memory device.

FIG. 16 shows the comparison of writing characteristics, and FIG. 17 compares the erasing characteristics. The solid line in the diagrams indicate the conventional semiconductor memory device, whereas the broken line refers to the characteristic of the semiconductor memory device formed in the embodiment. The axis of abscissas denotes the writing time or erasing time, and the axis of ordinates represents the threshold voltage of the memory cell. The writing characteristic is nearly same as in the conventional semiconductor memory device, but the erasing is found to be shorter in time than in the prior art. The degree of fluctuations of characteristics is compared in FIG. 18 and FIG. 19. FIG. 18 refers to the writing characteristic fluctuation, and FIG. 19 is for erasing characteristic fluctuation. The axis of ordinates refers to the threshold voltage of memory cell, and the axis of abscissas denotes the writing time or erasing time. In the diagrams, the solid line shows the characteristic of the conventional semiconductor memory device, whereas the broken line represents the semiconductor memory device of the embodiment. As for the writing characteristic, it is known that characteristic fluctuations due to alignment deviations are large in the conventional semiconductor memory device. In the semiconductor memory device of the embodiment, fluctuations are considerably small. The same holds true with the erasing characteristics. From such reasons, in the invention, it is not required to consider the alignment margin between the floating gate electrode mask and the mask for forming the tunneling window in which the tunneling medium is formed as required in the prior art, and the cell layout may be designed freely, so that a semiconductor memory device of a higher performance is obtained in a smaller area. Thus, as clear from the description herein, according to the structure and manufacturing method of the invention, since the tunneling region is automatically controlled by the diffusion of the N type diffusion layer from the floating gate electrode end in the lateral direction, the manufacturing process is simple, and it is not consider the alignment margin, so that stable operation and smaller cell area may be realized.

Therefore, the spirit and scope of the appended claims should not be limited the description of the preferred versions contained herein,

What is claimed is:

1. A method of manufacturing a semiconductor memory device comprising the steps of:

(a) forming a first gate dielectric film over a semiconductor substrate, (b) forming a first conductive film to be used as a floating gate electrode over said first gate dielectric film, (c) forming a first dielectric film over the first conductive film, (d) forming a first pattern of the first conductive film in a region for forming the floating gate electrode by etching the first dielectric film and the first conductive film, said region disposed over an area for forming a drain region, said first pattern having the first dielectric film thereon, (e) forming a second gate dielectric film at least on a side surface of said first pattern and on the semiconductor substrate, (f) forming a second pattern of a second conductive film to be used as a control gate electrode so as to cover said first pattern and said second gate dielectric film provided in an offset region, (g) forming the floating gate electrode and the control gate electrode by removing i) said second pattern, ii) said first dielectric film and iii) said first pattern which are disposed over the area for forming the drain region, and (h) forming a source diffusion layer and a drain diffusion layer by self-alignment ion implantation by using a mask comprising said control gate electrode.

2. A method of manufacturing a semiconductor memory device according to claim 1, therein one of i) at least two floating gate electrodes and ii) at least two control gate electrodes are formed in step (g).

3. A method of manufacturing a semiconductor memory device of claim 1, wherein said first gate dielectric film is used as a tunneling medium.

4. A method of manufacturing a semiconductor memory device of claim 1, wherein said a semiconductor substrate is of one conductive type and said source diffusion layer and said drain diffusion layer are formed by implanting ions of a second conductive type into said semiconductor substrate, said second conductive type opposite said first conductive type.

5. A method of manufacturing a semiconductor memory device of claim 1, further comprising the steps of:

(i) forming a second dielectric film over the surface of said control gate electrode, said source diffusion layer and said drain diffusion layer, (j) forming a contact hole in said second dielectric film and said first gate dielectric film, and (k) forming a contact in said contact hole.

6. A method of manufacturing a semiconductor memory device of claim 1, wherein said first gate dielectric film has a thickness of about 10 nm.

7. A method of manufacturing a semiconductor memory device of claim 1, wherein said floating gate electrode has a width of about 1 $\mu$m.

8. A method of manufacturing a semiconductor memory device of claim 1, wherein said control gate electrode has a width of about 2 $\mu$m.

9. A method of manufacturing a semiconductor memory device of claim 1, wherein said first dielectric film comprises a double-layered film including a nitride film and an oxide film.

* * * * *

UNITED STATES PATENT AND TRADEMARK OFFICE
CERTIFICATE OF CORRECTION

PATENT NO.   : 5,994,184
DATED        : November 30, 1999
INVENTOR(S)  : Fukumoto It is certified that error appears in the above-identified patent and that said Letters Patent is hereby corrected as shown below:

Column 12,
Line 2, "therein" should be -- wherein --.

Signed and Sealed this

Twenty-first Day of May, 2002

Attest:

Attesting Officer

JAMES E. ROGAN
Director of the United States Patent and Trademark Office